(12) United States Patent
Aikawa et al.

(10) Patent No.: US 7,061,333 B2
(45) Date of Patent: Jun. 13, 2006

(54) SLOT LINE BASED HIGH FREQUENCY OSCILLATOR USING TWO-PORT ELEMENT

(75) Inventors: Masayoshi Aikawa, Yokohama (JP); Takayuki Tanaka, Saga (JP); Fumio Asamura, Saitama (JP); Takeo Oita, Saitama (JP)

(73) Assignees: Masayoshi Aikawa, Kanagawa (JP); Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/329,862

(22) Filed: Dec. 26, 2002

(65) Prior Publication Data
US 2003/0121892 A1 Jul. 3, 2003

(30) Foreign Application Priority Data
Dec. 28, 2001 (JP) .............................. 2001-401931
Jan. 17, 2002 (JP) .............................. 2002-009258

(51) Int. Cl.
*H03B 5/18* (2006.01)
(52) U.S. Cl. ....................................... 331/56; 331/115
(58) Field of Classification Search ................. 331/56, 331/115, 107 SL, 107 G, 107 DP; 333/204, 333/219
See application file for complete search history.

(56) References Cited

U.S. PATENT DOCUMENTS 5,021,748 A * 6/1991 Chang et al. ................ 330/286
5,659,274 A * 8/1997 Takahashi et al. .......... 333/204

OTHER PUBLICATIONS

Kennedy, Electroinc Communication System, 1977 McGraw-Hill, Inc., Second Edition, pp. 232-239.*

* cited by examiner

*Primary Examiner*—Joseph Chang
(74) *Attorney, Agent, or Firm*—Katten Muchin Rosenman LLP

(57) ABSTRACT

A high frequency oscillator has a substrate, a resonator circuit which is disposed on one principal surface of the substrate and consists of a closed loop-shaped slot line including an inner conductor and an outer conductor, an electric boundary point set on the slot line, a two-port negative resistance element for connecting between the inner conductor and outer conductor, and an output line electrically connected to the slot line. The electric boundary point is set by connecting, for example, a stub to the resonator circuit. The stub functions as an electrically short-circuited end or an electrically open end. A Gunn diode is preferably used for the negative resistance element, and inserted at a position of the slot line resonator circuit at which impedance matching is achieved.

23 Claims, 14 Drawing Sheets

SLOT LINE BASED HIGH FREQUENCY OSCILLATOR USING TWO-PORT ELEMENT

BACKGROUND OF THE INVENTION

1. Field of the Invention

The present invention relates to a high frequency oscillator for a microwave band and a millimeter band which employs a two-port element as an oscillation element, and more particularly, to a high frequency oscillator which employs a slot line based planar resonator circuit.

2. Description of the Related Arts

A high frequency oscillator for a microwave band or a millimeter band is a highly significant component in terms of performance as well as cost even among main components used in a high frequency apparatus or a high speed apparatus. A high frequency oscillator of the type mentioned above employs a planar resonator circuit of a microstrip line type. FIG. 1A is a plan view illustrating an example of such a conventional high frequency oscillator, and FIG. 1B is a cross-sectional view taken along a line A—A in FIG. 1A.

The high frequency oscillator illustrated in FIGS. 1A and 1B comprises microstrip line resonator circuit 1, and a two-port negative resistance element (i.e., oscillation element) such as Gunn diode 2. Resonator circuit 1 comprises substrate 3 made of a dielectric material or the like; circular circuit conductor 1A formed on one principal surface of substrate 3; and ground conductor 4 formed substantially over the entirety of the other principal surface of substrate 3. On the one principal surface of substrate 3, matching line 5 is extended from one end (left end in FIG. 1A) on the periphery of circuit conductor 1A, and one end of Gunn diode 2 is connected to this matching line 5. The other end of Gunn diode 2 is connected to ground conductor 4 through a via hole, not shown. Output line 6 having a microstrip line structure is also connected to the other end (right end in FIG. 1A) on the periphery of circuit conductor 1A, and another matching line 5 is connected to output line 6.

In the illustrated high frequency oscillator, Gunn diode 2 presents a negative resistance in a resonant frequency region of microstrip line resonator circuit 1. Resonator circuit 1 is powered by Gunn diode 2 to maintain a resonant state, resulting in oscillation. The oscillation frequency generally depends on the resonant frequency of resonator circuit 1 which is determined by the size of circuit conductor 1A and the dielectric coefficient of substrate 3. It should be noted that discrete elements such as Gunn diode 2 are much expected as oscillation elements, particularly in a millimeter band and the like, because they are relatively inexpensive.

However, in the high frequency oscillator configured as described above, the negative resistance element such as a Gunn diode has relatively low impedance, while the microstrip line resonator circuit has high impedance, so that it is generally difficult to match the impedance between the two components. In addition, the substrate must be provided with a via hole for grounding the Gunn diode in high frequency terms, causing deteriorated characteristics resulting from a parasitic reactance of the via hole, for example, a reduction in oscillation output (oscillation power) associated with a circuit loss, particularly when the oscillation frequency is high. Moreover, the requirement for a process for forming the via hole impedes an improved productivity.

A high frequency oscillator proposed for solving problems such as a reduction in oscillation power utilizes a higher order resonance mode (for example, $TM_{21}$) of microstrip line resonator circuit 1, and Gunn diodes 2 connected through matching lines 5 to a plurality of equipotential points located at geometrically symmetric points on resonator circuit 1, as illustrated in FIG. 2, to combine oscillation outputs. However, even this high frequency oscillator needs a via hole and accordingly cannot avoid the influence of the parasitic reactance on the via hole.

SUMMARY OF THE INVENTION

It is an object of the present invention to provide a highly productive high frequency oscillator which facilitates a variety of circuit designs including the impedance matching and readily provides an increased oscillation output.

The inventors found that the problem in the conventional high frequency oscillator was caused by the microstrip line resonator circuit which had the circuit conductor (i.e., signal line) formed on one principal surface of the substrate and the ground conductor on the other principal surface. Then, the inventors perceived a slot line based planar resonator circuit in which a high frequency signal propagates between an inner conductor and an outer conductor formed on the same principal surface of a substrate, and reached the completion of the present invention.

Specifically, the object of the present invention is achieved by a high frequency oscillator which includes a substrate, a resonator circuit which is disposed on one principal surface of the substrate and consists of a closed loop-shaped slot line including an inner conductor and an outer conductor, an electric boundary point set on the slot line, a two-port negative resistance element for connecting between the inner conductor and the outer conductor, and output means electrically connected to said slot line.

In the present invention, since the slot line resonator circuit is applied for connection of the two-port negative resistance element, the negative resistance element can be grounded in high frequency terms on the one principal surface of the substrate. This eliminates the need for a via hole otherwise required when a microstrip line resonator circuit is used, so that the negative resistance element is readily mounted with a reduced circuit loss and parasitic reactance component, resulting in the oscillation characteristic advantageous in the microwave band and millimeter band. Also, since the slot line resonator circuit has different impedances at different points on the slot line due to a standing wave generated along the slot line, the impedance matching can be readily achieved between the negative resistance element and slot line resonator circuit only by appropriately determining where the negative resistance element should be connected, without providing a matching line or a matching circuit. The ease of impedance matching results in readiness in the designing of various circuits including the impedance matching, readiness in increasing the output of the oscillator, and a higher productivity of the oscillator.

In the present invention, the electric boundary point is set on the slot line resonator circuit, for example, by providing a slot line stub connected in series with the slot line resonator circuit, or by providing a microstrip line electromagnetically coupled to both the inner conductor and outer conductor of the slot line resonator circuit on the other principal surface of the substrate, or by providing a capacitor for connecting the inner conductor to the outer conductor of the slot line resonator circuit. The output line in turn may be a microstrip line routed on the other principal surface of the substrate for inducing electromagnetic coupling to the slot line resonator circuit, or a slot line connected in series with the slot line resonator circuit, or a coplanar line (or coplanar waveguide) connected in series with the slot line resonator circuit.

As described above, the present invention can facilitate the configuration of the high frequency oscillator, increase the oscillation output, oscillate at higher frequencies, and improve the quality of the oscillation through the utilization of the transmission characteristic and line structure of the slot line routed on one principal surface of the substrate and the output line electrically connected to the slot line. Specifically, the high frequency oscillator configured according to the present invention can provide the following advantages.

(1) The use of a slot line permits a semiconductor diode or a negative resistive IC (integrated circuit) chip, which serves as the negative resistance element, to be mounted on the one principal surface of the substrate by surface mounting or flip-chip mounting based on bump techniques, so that the negative resistance element can be satisfactorily grounded in high frequency terms. The resulting high frequency oscillator also excels in the oscillation at higher frequencies, for which a high mounting accuracy is required, as well as in the productivity. Particularly, a reduction in cost can be readily accomplished for a high frequency oscillator for use in a millimeter band and the like by using relatively inexpensive semiconductor diodes.

(2) Since a high frequency electromagnetic field does not affect near the center of the inner conductor of the slot line resonator circuit, this position can be utilized to apply a DC bias voltage or a DC bias current without interfering with the high frequency oscillation signal. In addition, since the oscillation output can be readily led out through the output line, which may be a microstrip line, by way of example, through electromagnetic coupling, it is possible to arbitrary set a coupling degree of the oscillator to an external line through the designing.

(3) The impedance matching of the negative resistance element with the slot line resonator circuit can be appropriately selected in consideration of a resonance mode of the resonator circuit.

(4) The oscillation frequency can be readily controlled only by disposing a variable reactance element at the electric boundary point. In addition, by virtue of its excellence in multi-element power combination oscillation as well as the ability to implement the push-push oscillation for generating a second harmonic or a fourth harmonic with respect to the fundamental frequency of oscillation, the high frequency oscillator of the present invention is effective in ultra-high frequency oscillation in a millimeter band, a sub-millimeter band and the like.

DETAILED DESCRIPTION OF THE INVENTION

Figure 1A:
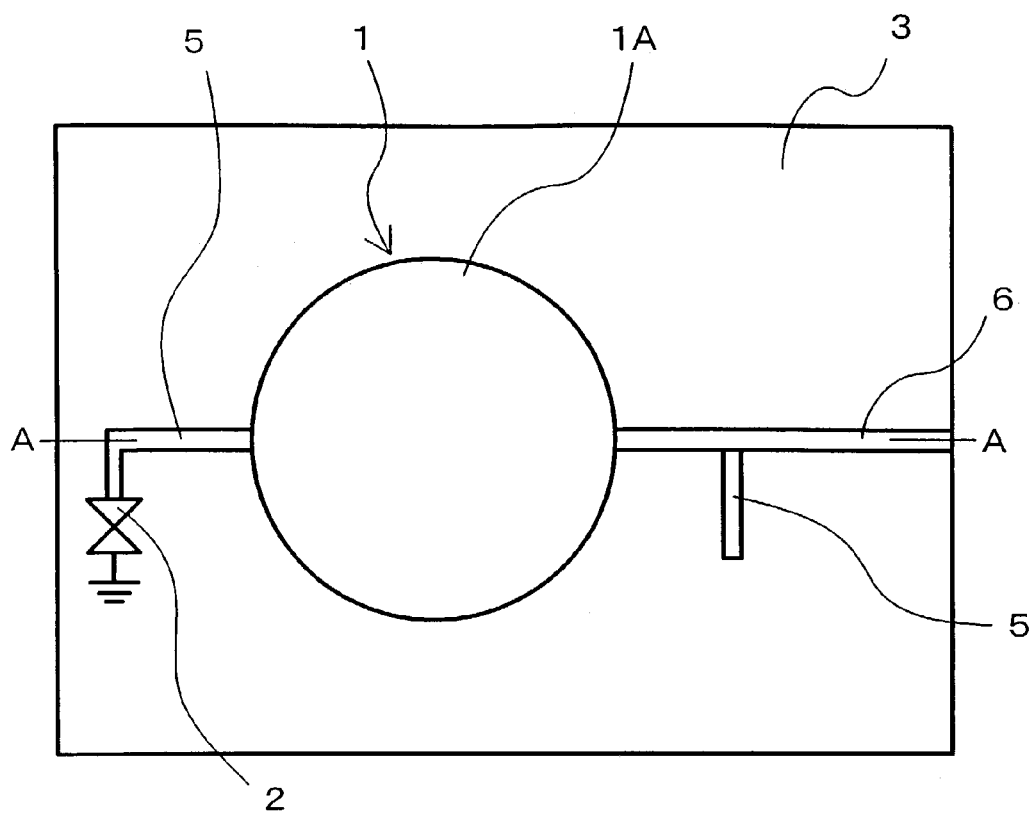
FIG. 1A is a plan view illustrating an example of conventional high frequency oscillators.
Figure 1B:
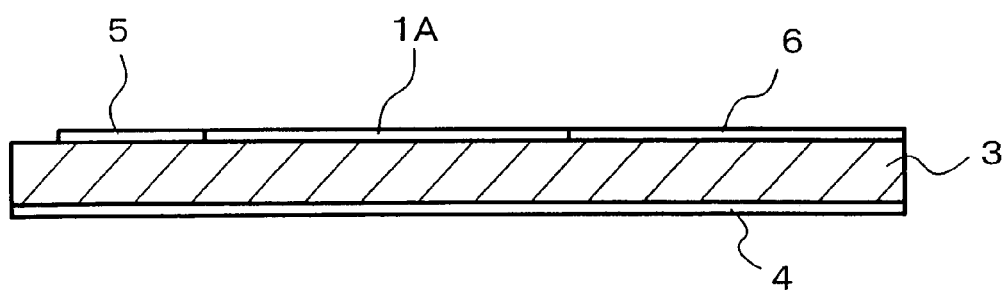
FIG. 1B is a cross-sectional view taken along a line A—A in FIG. 1A.

A high frequency oscillator according to a first embodiment of the present invention comprises a ground conductor formed substantially over the entirety of one principal surface of substrate 3 made, for example, of a dielectric material. This ground conductor is formed with a loop-shaped elongated opening which constitutes loop-shaped or endless slot line resonator circuit 7. In the ground conductor, a portion located inside the loop-shaped opening of slot line resonator circuit 7 is called "inner conductor 8" while a portion located outside the opening is called "outer conductor 9." In the illustrated high frequency oscillator, slot line resonator circuit 7 comprises an annular slot line. A high frequency component propagates through the slot line by the action of an electric field and a magnetic field produced between inner conductor 8 and outer conductor 9.

Slot line resonator circuit 7 has an electric length set at an integer multiple of $\lambda$, where $\lambda$ represents a wavelength corresponding to a frequency at which the high frequency oscillator should oscillate. Assume herein that the electric length of slot line resonator circuit 7 is just $\lambda$. A left end position of slot line resonator circuit 7 in FIG. 3A serves as an electric boundary point, at which connected is slot line stub 10 which has a slot line structure with its leading end being short-circuited. Slot line stub 10 extends over a length of approximately $\lambda/4$ toward inner conductor 8 and outer conductor 9, respectively, from a point at which slot line stub 10 is connected to slot line resonator circuit 7, such that it is substantially perpendicular to the slot line of slot line resonator circuit 7. Slot line stub 10 is electrically connected in series with slot line resonator circuit 7.

The high frequency oscillator is provided with Gunn diodes 2, which are two-port negative resistance elements, used as oscillation elements. The illustrated high frequency oscillator comprises four Gunn diodes 2 which are loaded on slot line resonator circuit 7. These four Gunn diodes 2 are mounted one by one, on both sides of the upper and lower ends, near positions distanced by approximately $\lambda/4$ (90 degrees) from the point of the slot line resonator circuit 7 at which slot line stub 10 is connected, i.e., near upper and lower ends of slot line resonator circuit 7, respectively. Each Gunn diode 2 has a pair of terminals electrically and mechanically connected to inner conductor 8 and outer conductor 9, respectively, for example, by flip chip mounting using bumps 16. A DC bias voltage to Gunn diodes 2 is supplied through lead wire 11 which is connected to a position near the center of inner conductor 8 which is less susceptible to the influence in high frequency terms. In this event, outer conductor 9 is at a DC ground potential.

Substrate 3 is further provided with output line 6 in a microstrip line structure on the other principal surface, which is electromagnetically coupled to the slot line of slot line resonator circuit 7. In the illustrated high frequency oscillator, output line 6 is disposed at a position opposite to the position of slot line resonator circuit 7, at which slot line stub 10 is connected, across slot line resonator circuit 7, i.e., at a geometrically symmetric point which is geometrically symmetric to slot line resonator circuit 7 in the direction opposite to the electric boundary point, such that it traverses the slot line of slot line resonator circuit 7.

In the high frequency oscillator as described above, an electric boundary point is formed at one end of slot line resonator circuit 7 by slot line stub 10. In this event, since slot line stub 10 having the length of one quarter wavelength is short-circuited at the leading end thereof, an electrically open end (i.e., open boundary) for the oscillation frequency is formed at one end of slot line resonator circuit 7. Since slot line resonator circuit 7 has the electric length equal to $\lambda$, the phase is opposite at this electric boundary point (point at the left end of the slot line resonator circuit 7 in FIG. 3A) and at the geometrically symmetric point thereof (point at the right end of the slot line resonator circuit 7 in FIG. 3A), and a maximum voltage is generated in opposite phase at these points. In addition, a minimum voltage is generated at midpoints (upper and lower ends of the slot line resonator circuit 7 in FIG. 3A) between the electric boundary point and geometrically symmetric point, resulting in a resonance mode by a standing wave with a voltage distribution having such maximum voltage points and minimum voltage points. A current distribution in this resonance mode is reverse to the voltage distribution in that a maximum current is generated at the minimum voltage points and a minimum current is generated at the maximum voltage points.

Since this high frequency oscillator has four Gunn diodes 2 located on slot line resonator circuit 7, the high frequency oscillator oscillates with the power supplied thereto from these Gunn diodes 2 in the resonant frequency region. Each Gunn diode 2 has a negative resistive value in the resonant frequency region. Then, an oscillation output, i.e., a combination of the power from respective Gunn diodes 2, is provided from the right-hand end of slot line resonator circuit 7 at which the maximum voltage is generated. Stated another way, the resulting oscillation output is a combination of outputs from four oscillation systems, which share slot line resonator circuit 7.

Figure 3A:
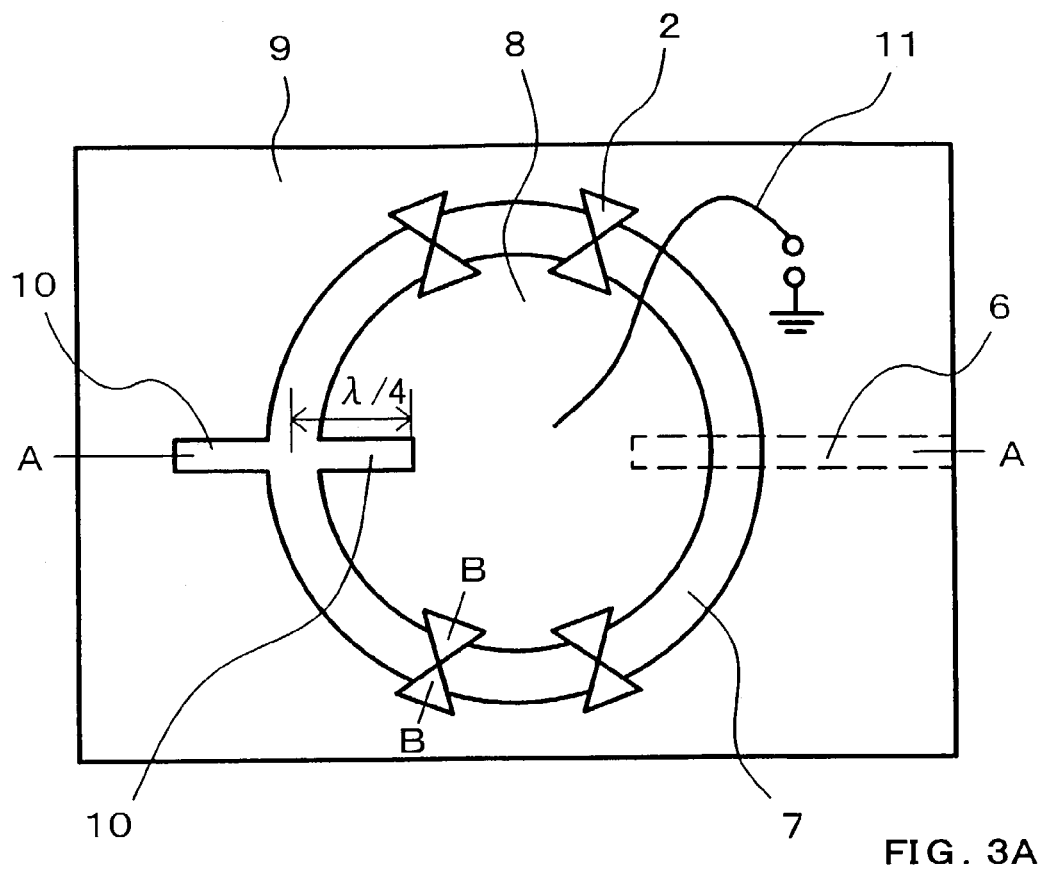
FIG. 3A is a plan view illustrating a high frequency oscillator according to a first embodiment of the present invention.
Figure 3B:
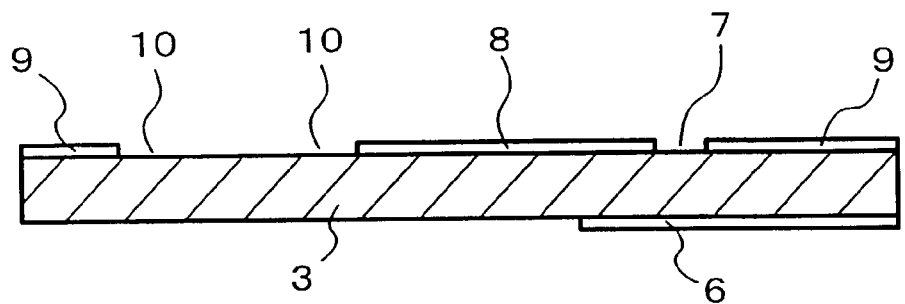
FIG. 3B is a cross-sectional view taken along a line A—A in FIG. 3A.
Figure 3C:
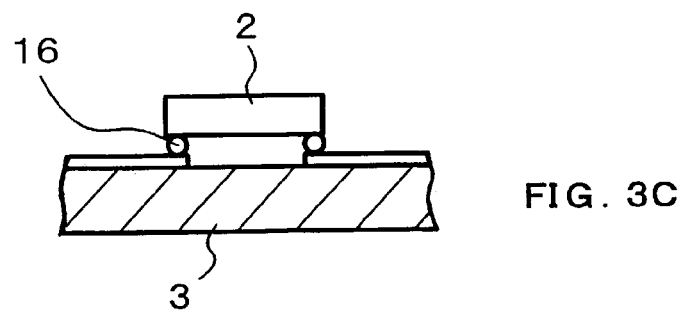
FIG. 3C is a cross-sectional view taken along a line B—B in FIG. 3A.

Since the standing wave is generated in slot line resonator circuit 7 such that the maximum voltage is generated at the left and right ends of slot line resonator circuit 7 in FIG. 3A, while the minimum voltage is generated at the midpoints between the maximum voltage points, slot line resonator circuit 7 has a continuously varying impedance characteristic which presents a maximum impedance at both ends and a minimum impedance at the midpoints. Since Gunn diodes 2 are directly mounted on such slot line resonator circuit 7, Gunn diodes 2 can be connected at locations in accordance with their impedance without the need for a matching circuit, thereby facilitating the designing of the oscillator. In this example, since Gunn diodes 2 are generally low in impedance, Gunn diodes 2 are positioned in low impedance regions near the upper and lower ends of slot line resonator circuit 7 at which the minimum voltage (maximum current) is generated. Moreover, in this example, a plurality (here, four) of Gunn diodes can be placed on slot line resonator circuit 7, the power from the respective Gunn diodes is combined to provide a large output, thereby quite readily implementing a multi-element power combination. While four Gunn diodes are arranged herein for increasing the oscillation output, basically, one or more Gunn diodes may be provided.

In the high frequency oscillator as described above, since slot line resonator circuit 7 is formed by disposing inner conductor 8 and outer conductor 9 on the same principal surface of substrate 3, negative resistance elements such as Gunn diodes 2 can be readily and accurately mounted on substrate 3 without forming via holes or the like, thereby increasing the productivity as well as reducing a circuit loss to further increase the oscillation output. In addition, since high frequency electromagnetic field does not affect near the center of inner conductor 8 in slot line resonator circuit 7, at which a DC bias voltage is applied to Gunn diodes 2, the influence of the DC bias current can be substantially ignored on the high frequency oscillation.

In the high frequency oscillator described above, the DC bias current is applied to Gunn diodes 2 from lead wire 11 through inner conductor 8. Alternatively, substrate 3 may be formed with a via hole through which the DC bias voltage is supplied to inner conductor 8 from the other principal surface of substrate 3. In this case, since the via hole is dedicated to the DC bias voltage, a circuit loss caused thereby can be substantially ignored in high frequency terms.

In the foregoing high frequency oscillator, slot line stub 10 extends in both the inner and outer sides from slot line resonator circuit 7 in order to ensure the formation of the electrically open ends. Alternatively, slot line stub 10 may extend only in one of these directions.

Figure 2:
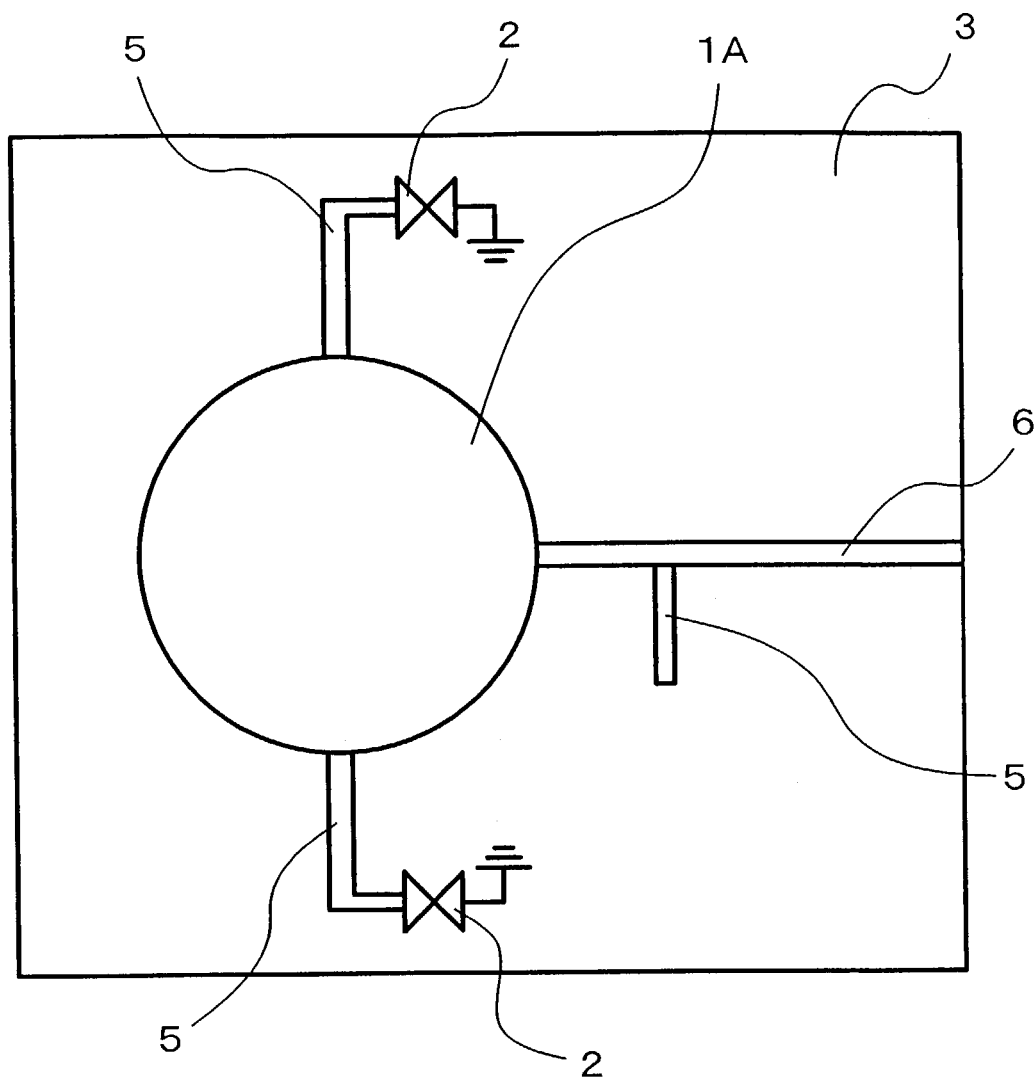
FIG. 2 is a plan view illustrating another example of conventional high frequency oscillators.

Next, a high frequency oscillator according to a second embodiment of the present invention will be described with reference to FIGS. 2A and 2B. In the high frequency oscillator according to the first embodiment described above, slot line stub 10 having the length of λ/4 in each direction is connected to slot line resonator circuit 7 such that the electric boundary point functions as an electrically open end for the oscillation frequency. In the high frequency oscillator according to the second embodiment, in turn, the electric boundary point is set as an electrically short-circuited end for the oscillation frequency.

Specifically, the high frequency oscillator according to the second embodiment comprises microstrip line stub 15 in a microstrip line structure disposed on the other principal surface of substrate 3, instead of slot line stub 10 in the high frequency oscillator according to the first embodiment. Microstrip line stub 15 overlaps the slot line of slot line resonator circuit 7 at its midpoint, and extends in a direction perpendicular to the slot line. Microstrip line stub 15 has an overall length set at λ/2, where λ represents a wavelength corresponding to the oscillation frequency of this high frequency oscillator. Microstrip line stub 15 is electromagnetically coupled to inner conductor 8 and outer conductor 9, so that these conductors 8, 9 are electrically connected to each other in high frequency terms. As noted, since the lengths of microstrip line stub 15 from the crossing with slot line resonator circuit 7 to both ends thereof are both equal to λ/4, microstrip line stub 15 constitutes an electric boundary point which functions as an electrically short-circuited end for the oscillation frequency.

Also, in this high frequency oscillator, the electric length of slot line resonator circuit 7 is assumed to be an odd-numbered multiple of one half of oscillation wavelength λ. For example, the electric length is set herein at 3λ/2. Output line 6 in a microstrip line structure is routed on the other principal surface of substrate 3 such that it intersects perpendicularly to a right end portion of slot line resonator circuit 7, as illustrated, in a manner similar to the first embodiment. Two Gunn diodes 2, which are oscillation elements, are disposed on slot line resonator circuit 7. Specifically, Gunn diodes 2 are disposed near both sides of the electric boundary point of slot line resonator circuit 7 which functions as an electrically short-circuited end.

Figure 4A:
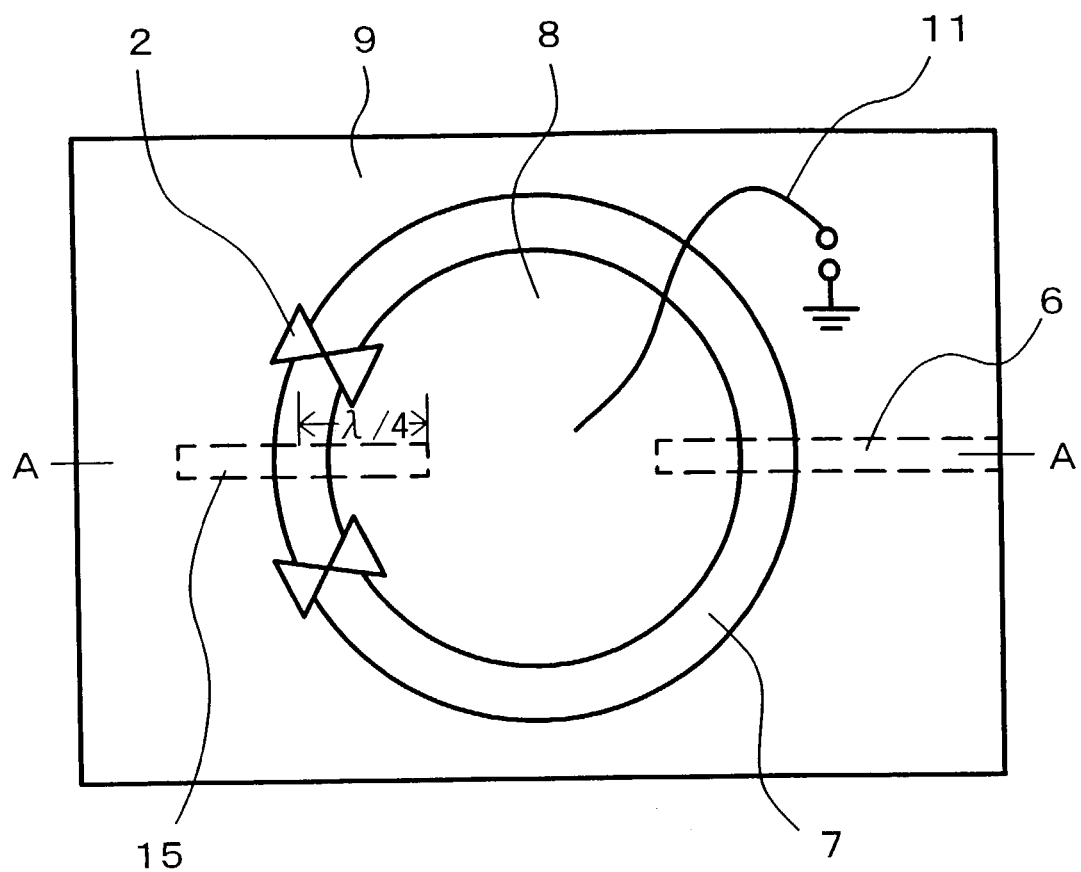
FIG. 4A is a plan view illustrating a high frequency oscillator according to a second embodiment of the present invention.

In the configuration as described above, slot line resonator circuit 7 presents a resonance mode by a standing wave with a voltage distribution having a minimum voltage point at the left end thereof in FIG. 4A, which functions as the electrically short-circuited point by the action of microstrip line stub 15, and a maximum voltage point at a geometrically symmetric point (right end in FIG. 4A) thereof in the opposite direction. A current distribution in this resonance mode is reverse to the voltage distribution in that a maximum current is generated at the minimum voltage point and a minimum current is generated at the maximum voltage point. As such, this high frequency oscillator can also provide an oscillation output through output line 6 disposed at the maximum voltage point. Since slot line resonator circuit 7 has a continuously varying impedance which is minimal at the electric boundary point, i.e., the minimum voltage point and maximal at the maximum voltage point, Gunn diodes 2 can be place at arbitrary positions at which the matching is readily achieved, as is the case with the first embodiment, thereby facilitating the designing. In the illustrated example, Gunn diodes 2 are positioned near both sides of the electrically short-circuited end of slot line resonator circuit 7 at which the impedance is relatively low.

Figure 5A:
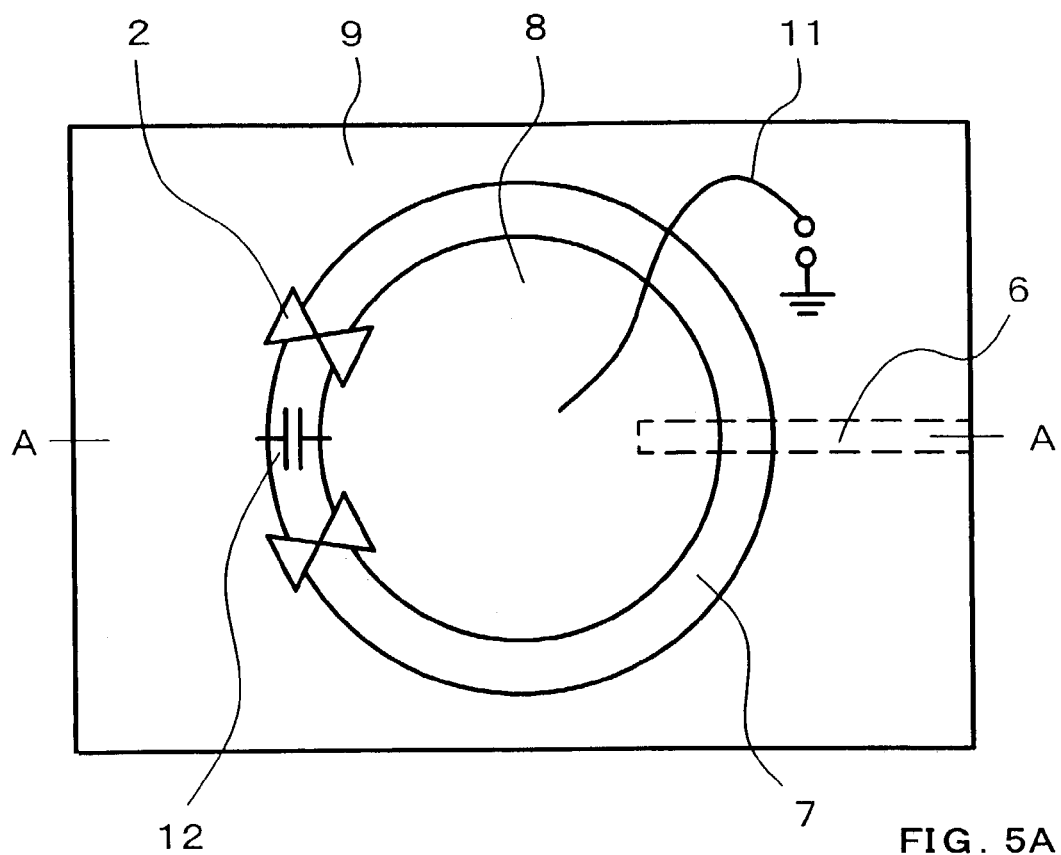
FIG. 5A is a plan view illustrating a high frequency oscillator according to a third embodiment of the present invention.
Figure 5B:
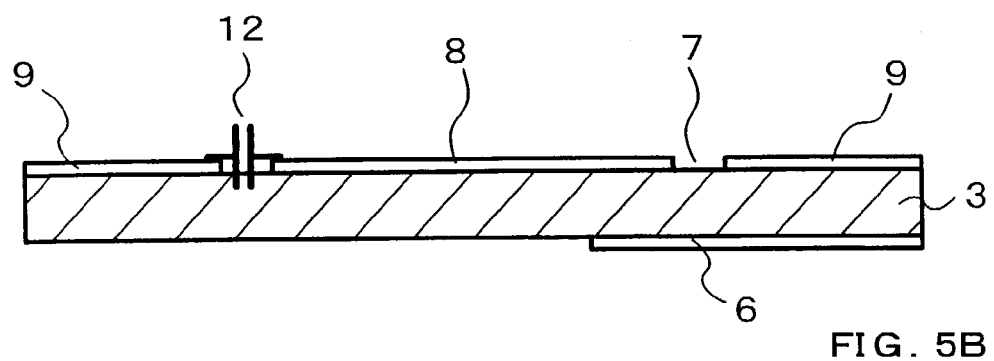
FIG. 5B is a cross-sectional view taken along a line A—A in FIG. 5A.

Next, a high frequency oscillator according to a third embodiment will be described with reference to FIGS. 5A and 5B. In the second embodiment described above, one end of slot line resonator circuit 7 is defined as an electric boundary point, which functions as an electrically short-circuited end for the oscillation frequency by the action of microstrip line stub 15 disposed on the other principal surface of substrate 3. In the third embodiment, in turn, a capacitor is used to form an electrically short-circuited end.

Figure 4B:
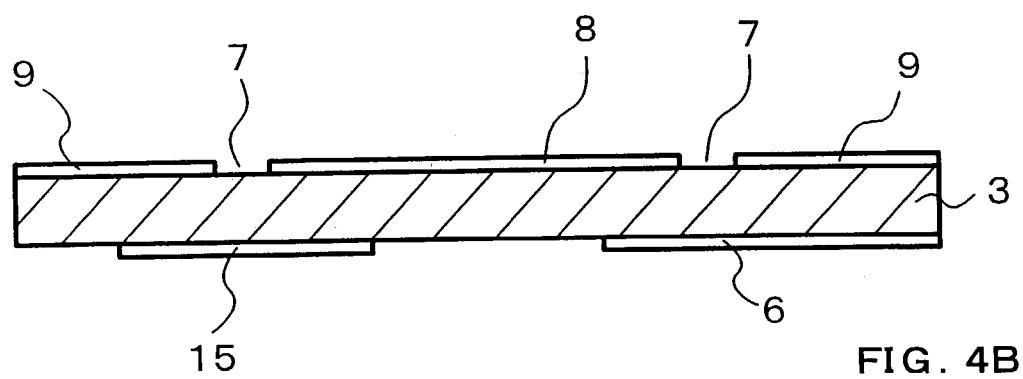
FIG. 4B is a cross-sectional view taken along a line A—A in FIG. 4A.

Specifically, the high frequency oscillator according to the third embodiment comprises capacitor 12 which connects between inner conductor 8 and outer conductor 9 of slot line resonator circuit 7 at the left end of slot line resonator circuit 7, instead of microstrip line stub 15 in the high frequency oscillator illustrated in FIGS. 4A and 4B. This capacitor 12 is connected substantially in parallel with slot line resonator circuit 7. Since capacitor 12 short-circuits inner conductor 8 to outer conductor 9 in high frequency terms, the position at which capacitor 12 is connected defines an electric boundary point which functions as an electrically short-circuited end of slot line resonator circuit 7. In the third embodiment, the length of slot line resonator circuit 7 is also set at an odd-numbered multiple of one half of the wavelength corresponding to the oscillation frequency.

In the foregoing configuration, slot line resonator circuit 7 also presents a resonance mode by a standing wave with a voltage distribution having a minimum voltage point at the left end thereof, and a maximum voltage point at a geometrically symmetric point (right end in FIG. 5A) thereof. As such, the high frequency oscillator can also provide an oscillation output through output line 6 disposed at the maximum voltage point. In addition, the high frequency oscillator of the third embodiment provides similar advantages to the second embodiment in that Gunn diodes 2 can be placed at locations at which the impedance matching can be readily achieved, thereby facilitating the designing of the oscillator. While capacitor 12 used herein can be a discrete type one, a gap capacitor may be formed simultaneously with the formation of slot line resonator circuit 7 in the same pattern in case of a high frequency band such as a millimeter band.

Next, description will be made on a high frequency oscillator according to a fourth embodiment of the present invention. The high frequency oscillator according to the fourth embodiment additionally comprises variable reactance elements such as varactor diodes added to any of the high frequency oscillators in the aforementioned embodiments to function as a variable frequency oscillator.

Figure 6A:
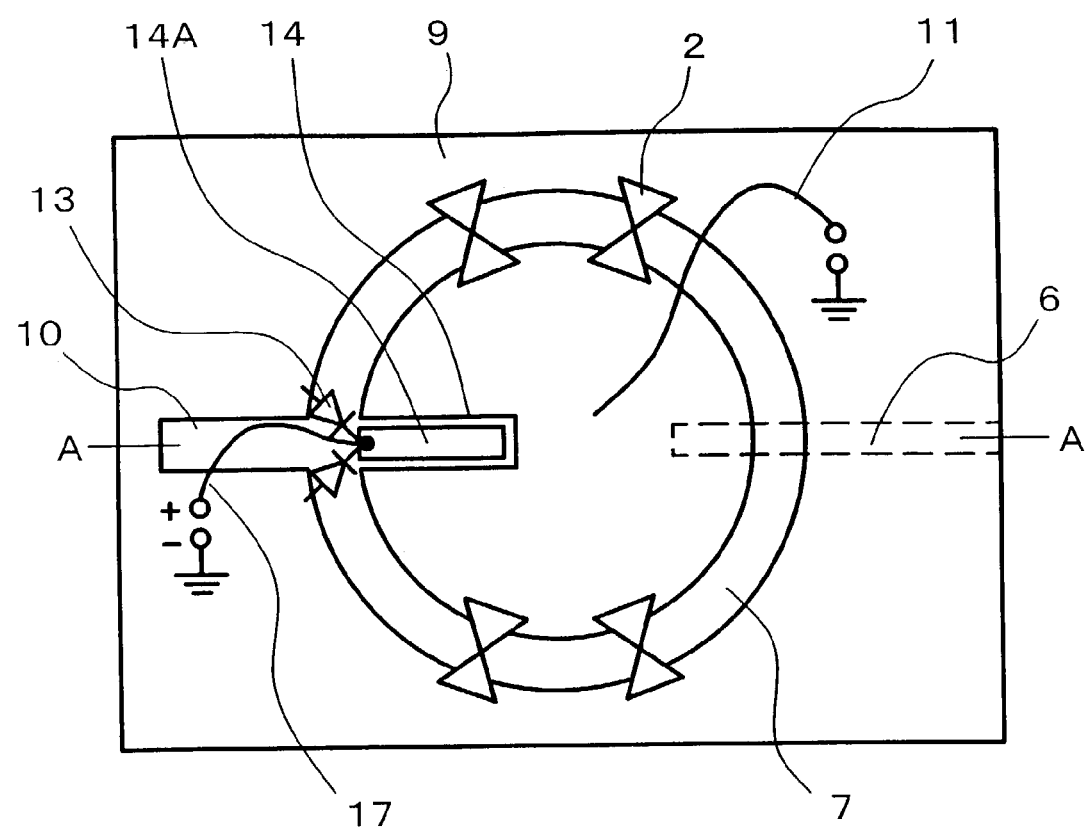
FIG. 6A is a plan view illustrating a variable frequency high frequency oscillator according to a fourth embodiment of the present invention.
Figure 6B:
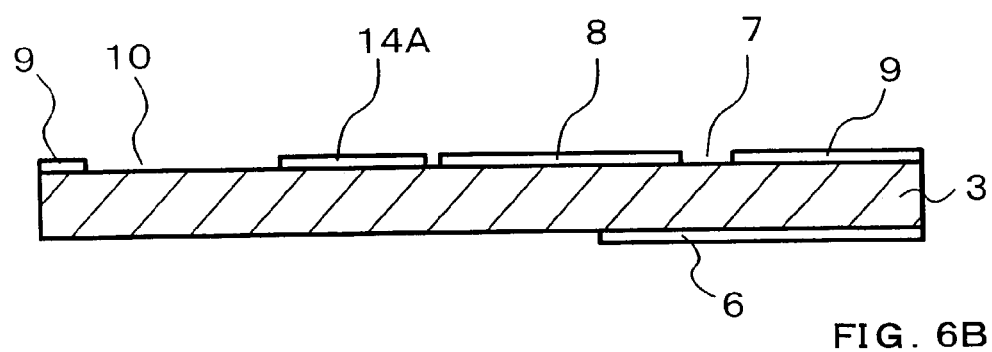
FIG. 6B is a cross-sectional view taken along a line A—A in FIG. 6A.

A high frequency oscillator illustrated in FIGS. 6A and 6B is a frequency variable version of the high frequency oscillator of the first embodiment. Here, in the high frequency oscillator of the first embodiment having slot line stub 10 connected to slot line resonator circuit 7 for defining the electrically boundary point which functions as an electrically open end, signal line 14A of approximately λ/4 long is disposed in a portion of stub 10 extending toward inner conductor 8, to form coplanar line 14 which has an open leading end. Because of its length equal to λ/4, coplanar line 14 functions as an electrically short-circuited end for the oscillation frequency. A pair of varactor diodes 13 is provided with their cathodes being connected to each other, and the common cathode is connected to coplanar line 14. Varactor diodes 12 in the pair have their anodes connected to outer conductor 9 on both sides of slot line stub 10 near the intersection of slot line stub 10 with slot line resonator circuit 7. Lead wire 17 is further provided for applying a control voltage to the common cathode.

In this high frequency oscillator, a pair of varactor diodes 13 is inserted in parallel with the slot line of slot line resonator circuit 7 through coplanar line 14 which is electrically short-circuited. The capacitance of each varactor diode 13 changes in response to a control voltage applied to the cathode through lead wire 17 and the like, causing an associated change in the electric length of slot line resonator circuit 7 to vary the oscillation frequency.

Figure 7A:
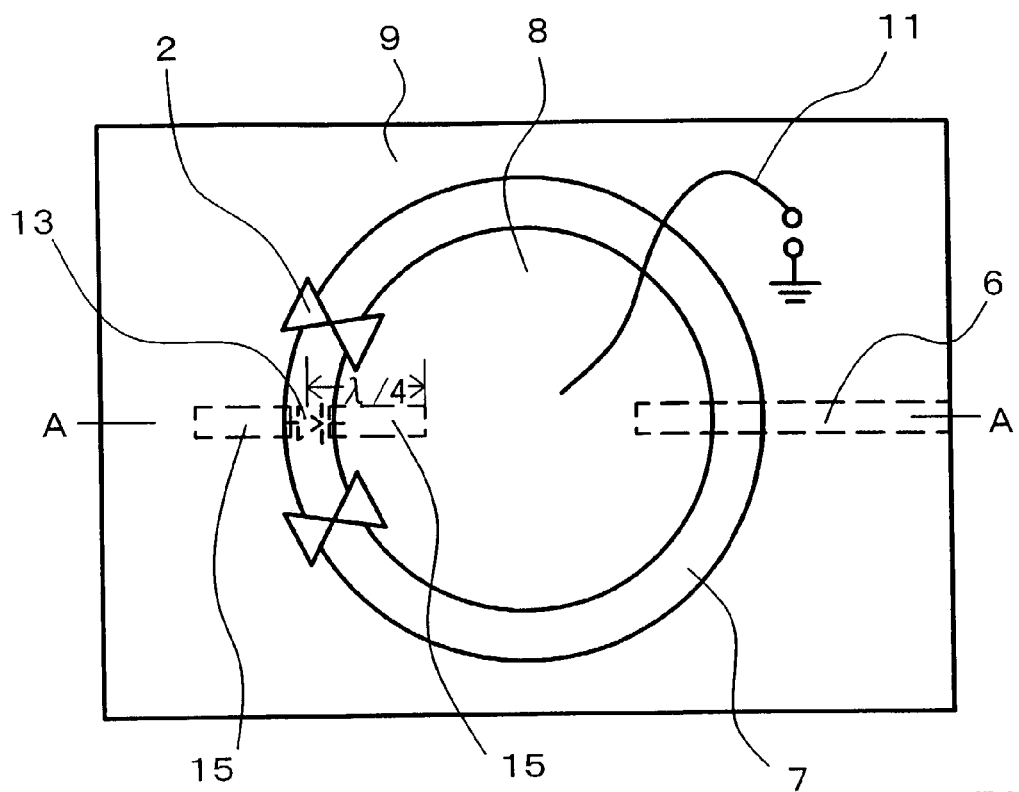
FIG. 7A is a plan view illustrating another example of the variable frequency high frequency oscillator according to the fourth embodiment.
Figure 7B:
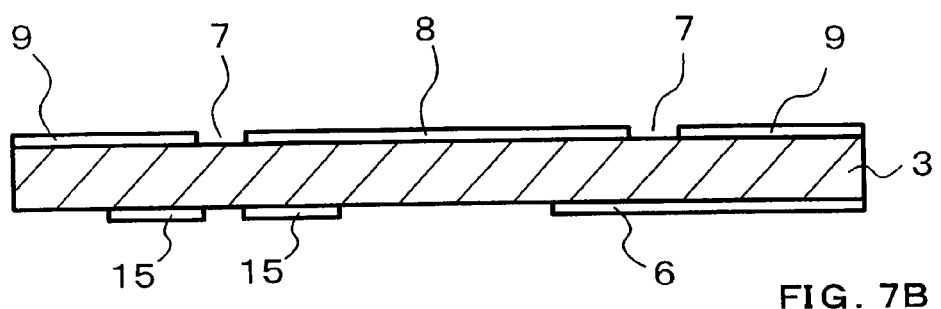
FIG. 7B is a cross-sectional view taken along a line A—A in FIG. 7A.
Figure 7C:
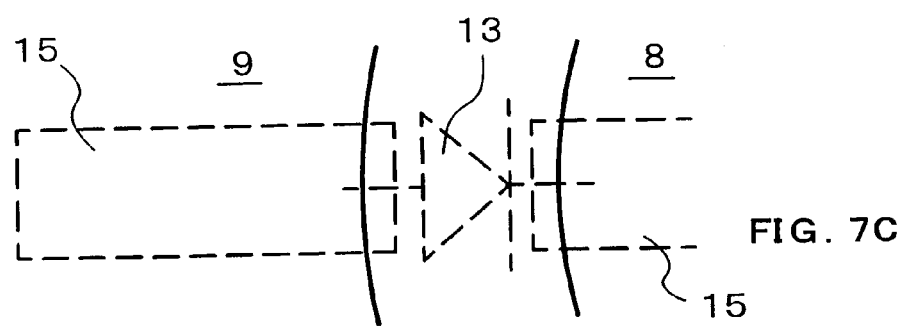
FIG. 7C is a partially enlarged view illustrating surroundings of an electrically boundary point in the high frequency oscillator illustrated in FIG. 7A.

A high frequency oscillator illustrated in FIGS. 7A to 7C is a variable frequency version of the high frequency oscillator according to the second embodiment. Here, microstrip line stub 15 disposed on the other principal surface of substrate 3 is divided at the midpoint thereof, and varactor diode 13 is inserted at this dividing position such that the anode and cathode of varactor diode 13 are connected to the divided halves of microstrip line stub 15, respectively. Though not shown herein, a control voltage is applied between the cathode and anode of varactor diode 13.

In the high frequency oscillator thus configured, varactor diode 13 is inserted in series with slot line resonator circuit 7, so that the capacitance of varactor diode 13 changes in response to the control voltage applied between the anode and cathode of varactor diode 13, as mentioned above, causing an associated change in the electric length of slot line resonator circuit 7 to vary the oscillation frequency.

Figure 8A:
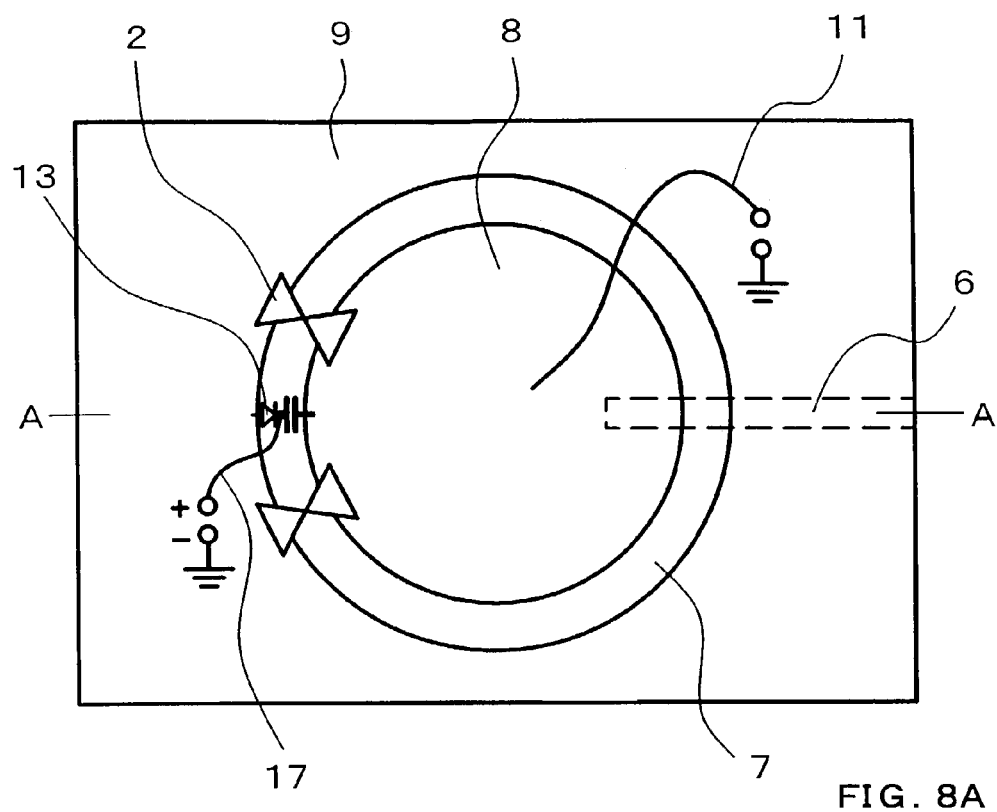
FIG. 8A is a plan view illustrating a further example of the variable frequency high frequency oscillator according to the fourth embodiment.
Figure 8B:
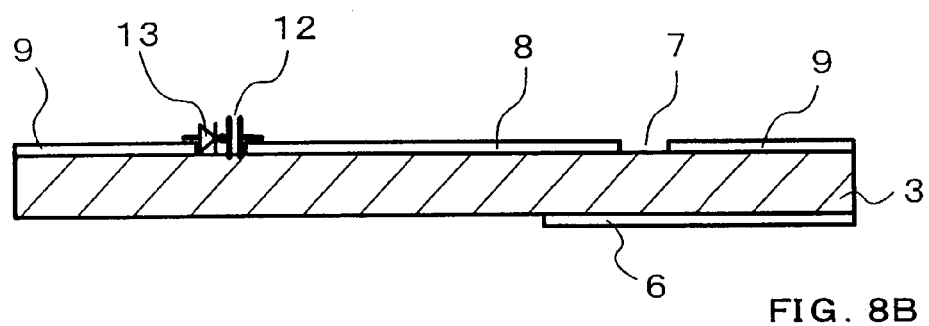
FIG. 8B is a cross-sectional view taken along a line A—A in FIG. 8A.
Figure 8C:
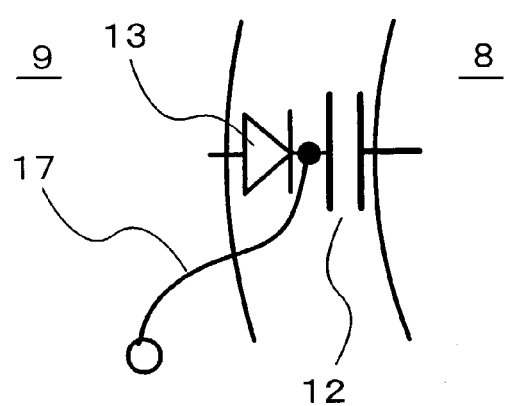
FIG. 8C is a partially enlarged view illustrating surroundings of an electrically boundary point in the high frequency oscillator illustrated in FIG. 8A.

A high frequency oscillator illustrated in FIGS. 8A to 8C is a variable frequency version of the high frequency oscillator according to the third embodiment. Specifically, the illustrated high frequency oscillator comprises varactor diode 13 inserted between capacitor 12 and outer conductor 9 such that the anode of varactor diode 13 is connected to outer conductor 9 in the high frequency oscillator of the third embodiment. Lead wire 17 is also provided for applying a control voltage to a point at which capacitor 12 is connected to the cathode of varactor diode 13.

In the high frequency oscillator thus configured, varactor diode 13 is inserted in series with the slot line of slot line resonator circuit 7 through capacitor 12, so that the capacitance of varactor diode 13 changes in response to the control voltage applied between the anode and cathode of varactor diode 13, as mentioned above, causing an associated change in the electric length of slot line resonator circuit 7 to vary the oscillation frequency.

Figure 9A:
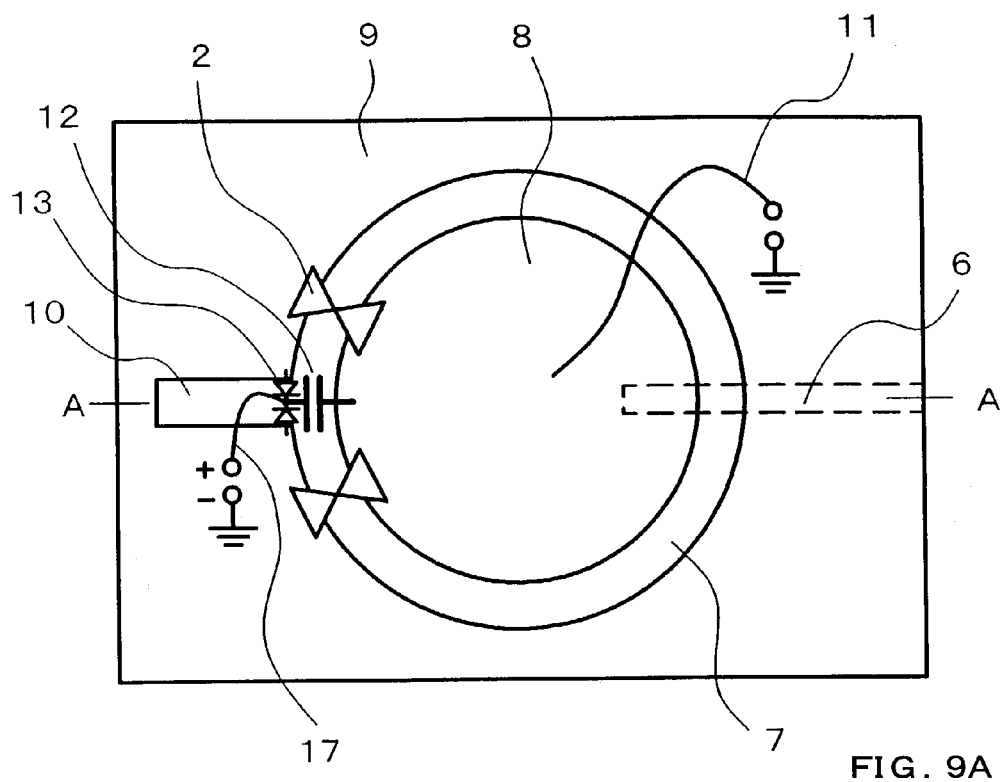
FIG. 9A is a plan view illustrating a yet further, example of the variable frequency high frequency oscillator according to the fourth embodiment.
Figure 9B:
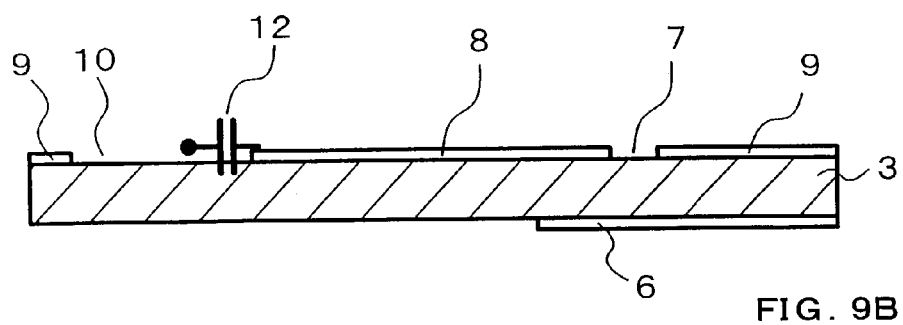
FIG. 9B is a cross-sectional view along a line A—A in FIG. 9A.

In the high frequency oscillator illustrated in FIGS. 8A to 8C, slot line stub 10 may be provided at the electric boundary point, as illustrated in FIGS. 9A and 9B. Specifically, at a left end position of slot line resonator circuit 7, slot line stub 10 of approximately λ/4 long is formed with its leading end being short-circuited. Slot line stub 10 extends toward outer conductor 9. Stub 10 functions as an electric open end for the oscillation frequency because it has a length equal to one-quarter wavelength, and is connected in series with slot line resonator circuit 7. Then, a pair of varactor diodes 13 is disposed with their cathodes being connected to each other, and the common cathode is connected to inner conductor 8 through capacitor 12. Varactor diodes 12 in the pair have their anodes connected to outer conductor 9 on both sides of slot line stub 10 near the intersection of slot line stub 10 with slot line resonator circuit 7. Lead wire 17 is further provided for applying a control voltage to the common cathode.

Figure 9C:
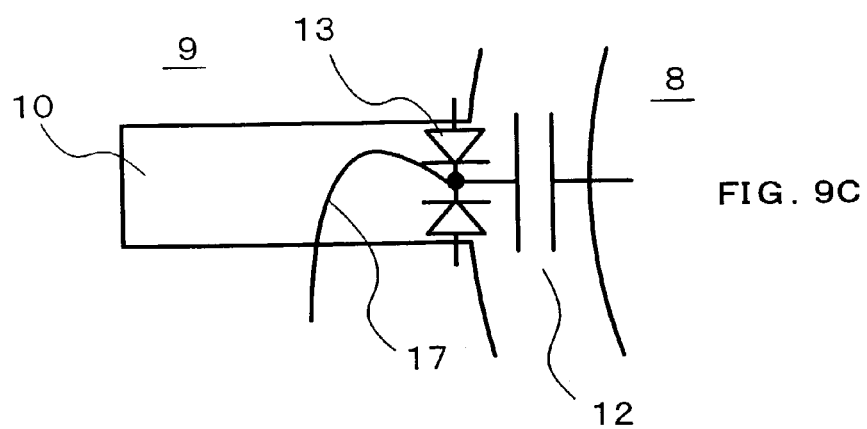
FIG. 9C is a partially enlarged view illustrating surroundings of an electrically boundary point in the high frequency oscillator illustrated in FIG. 9A.

In the high frequency oscillator illustrated in FIGS. 9A to 9C, varactor diodes 13 are inserted in series with slot line resonator circuit 7, so that the oscillation frequency of the high frequency oscillator can be varied by changing the control voltage applied to varactor diodes 13.

As described above, according to the fourth embodiment, the variable frequency high frequency oscillator can be provided in simple configurations when one end of slot line resonator circuit 7 is formed either with an electrically open end or with a short-circuited end. While the control voltage is applied to the cathodes of varactor diodes 13 through lead wire 17, the control voltage may be applied from the other principal surface of substrate 3 through a via hole formed through substrate 3.

Next, a sub-harmonic injection locked high frequency oscillator according to a fifth embodiment of the present invention will be described with reference to FIGS. 10A and 10B. This injection locked high frequency oscillator is intended for improving the stability and accuracy of the oscillation frequency by injecting a signal, that is, sub-harmonic synchronization signal, having a frequency, which is an integer sub-multiple of the frequency at which the oscillator should oscillate, into the high frequency oscillator from the outside.

Figure 10A:
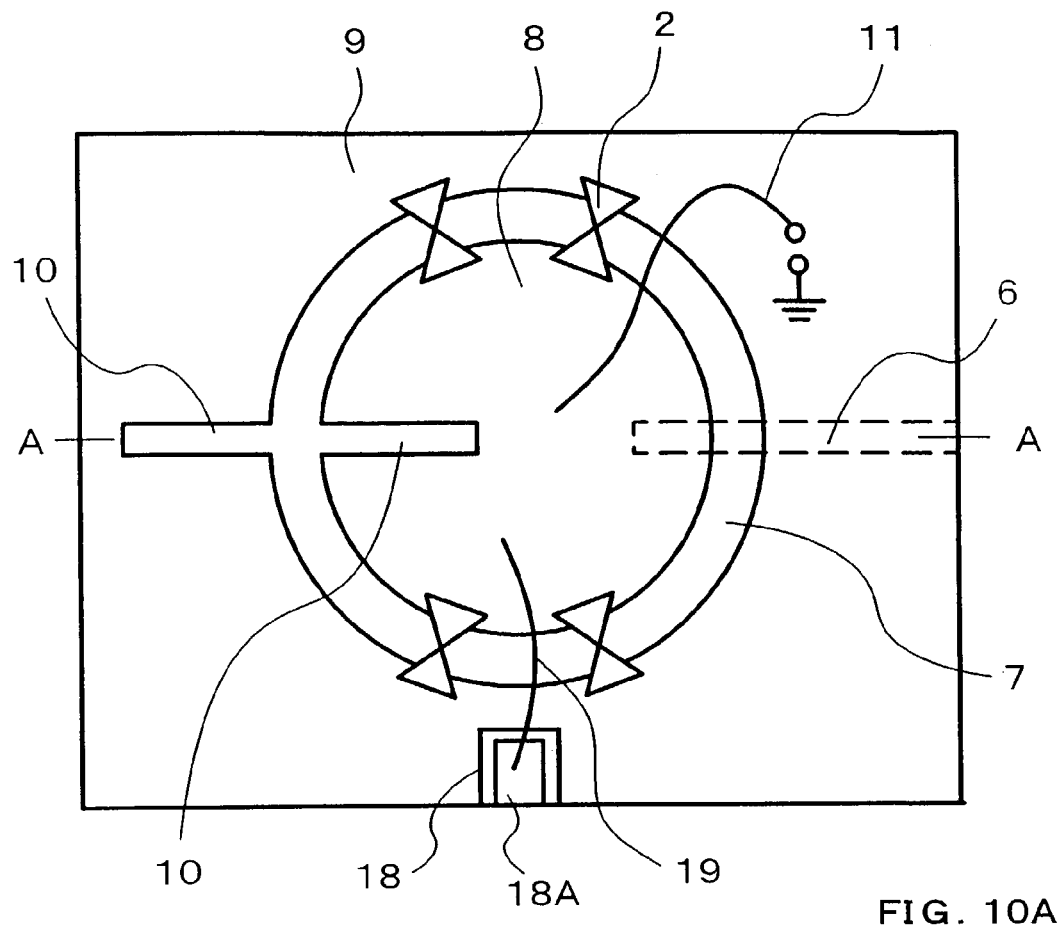
FIG. 10A is a plan view illustrating an injection locked high frequency oscillator according to a fifth embodiment of the present invention.
Figure 10B:
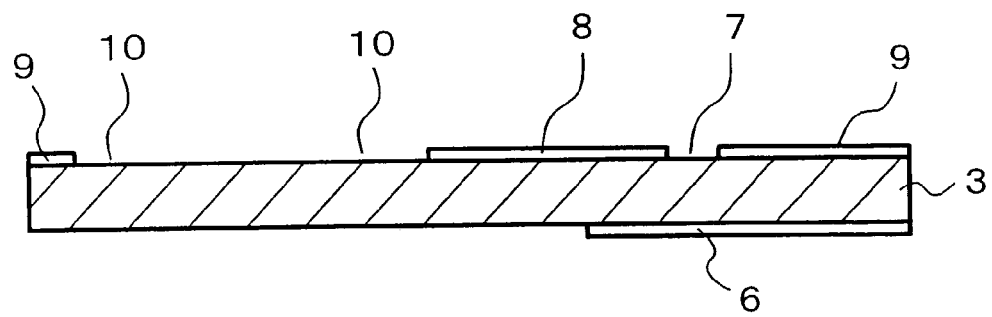
FIG. 10B is a cross-sectional view along a line A—A in FIG. 10A.

The high frequency oscillator illustrated in FIGS. 10A and 10B comprises coplanar line 18 extending from the periphery of substrate 3 to outer conductor 9 on the one principal surface of substrate 3 in the aforementioned high frequency oscillator according to the first embodiment. Signal line 18A of coplanar line 18 is connected to inner conductor 8 through lead wire 19. A synchronization signal having a frequency 1/n as high as the oscillation frequency is injected into inner conductor 8 through coplanar line 18, where n is a natural number.

In the high frequency oscillator as described above, the synchronization signal can be injected in a simple configuration. In addition, since the sub-harmonic synchronization signal contributes to matching of oscillation components in phase every n periods of the oscillation frequency, the high frequency oscillator can improve the phase noise characteristic and stabilize the frequency. Alternatively, rather than using lead wire 19, a microstrip line may be formed on the other principal surface of substrate 3 for injecting the synchronization signal to inner conductor 8 through a via hole. In the sub-harmonic injection locking, the synchronization signal is not affected by lead wire 19 or via hole because of its relatively low frequency. While the foregoing description has been made on an example in which the injection locking is applied to the high frequency oscillator of the first embodiment, similar sub-harmonic injection locked oscillation can be implemented in the high frequency oscillator of the second embodiment as well as the high frequency oscillator of the third embodiment by injecting the synchronization signal into inner conductor 8.

Next, a high frequency oscillator of two-phase push-push oscillation type according to a sixth embodiment of the present invention will be described with reference to FIGS. 11A and 11B. The push-push oscillator herein referred to comprise two oscillation systems configured to oscillate at the same frequency, and combines oscillation outputs from the two oscillation systems to cancel out fundamental frequency components of oscillation and leave even-numbered order harmonic components. In the two-phase push-push oscillation, the high frequency oscillator generates a component having the frequency twice as high as the fundamental frequency of oscillation in each oscillation system. In other wards, a double wave is obtained as an output.

Figure 11A:
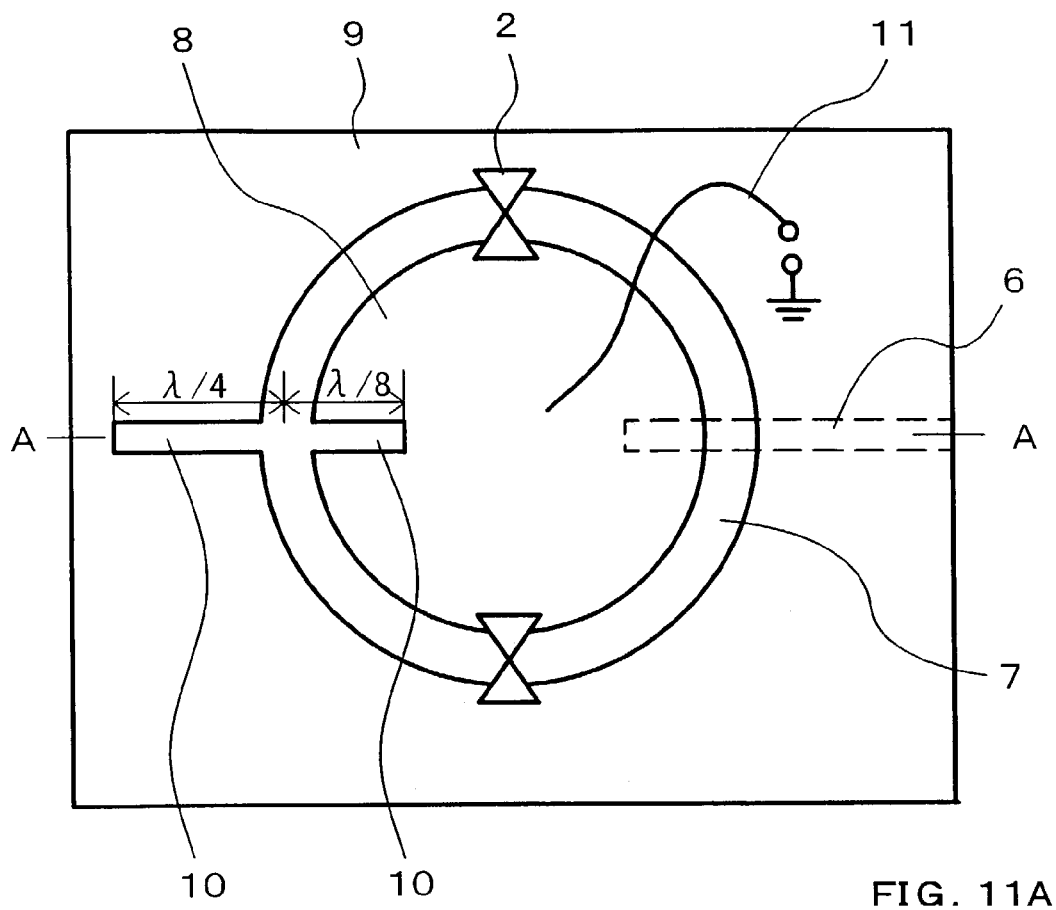
FIG. 11A is a plan view illustrating a two-phase push-push high frequency oscillator according to a sixth embodiment of the present invention.
Figure 11B:
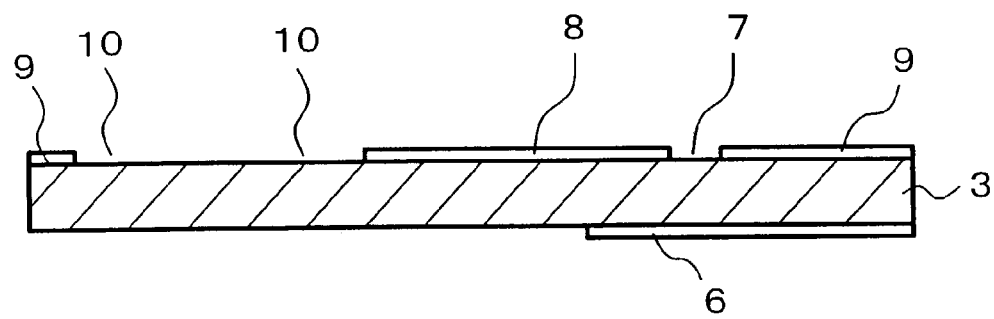
FIG. 11B is a cross-sectional view along a line A—A in FIG. 11A.

The configuration illustrated in FIGS. 11A and 11B implements the two-phase push-push oscillation in the aforementioned high frequency oscillator of the first embodiment. Basic difference between the high frequency oscillators of the sixth embodiment and first embodiment lie in that the oscillator of the first embodiment comprises slot line resonator circuit 7 having an electric length set at an integer multiple of λ, whereas the oscillator of the sixth embodiment comprises slot line resonator circuit 7 having an electric length set at an odd-numbered integer multiple of λ/2, for example, 3λ/2, for performing the push-push oscillation.

In addition, in the high frequency oscillator of the sixth embodiment, the left end of slot line resonator circuit 7 in FIG. 11A defines an electric boundary point which functions as an electrically open end for the fundamental oscillation frequency $f_0$ as well as for double wave $2f_0$ thereof. To this end, for example, slot line stub 10 having a length of λ/4 is extended toward outer conductor 9 such that it functions as an electric open end for the fundamental frequency component, and slot line stub 10 having a length of λ/8 is extended toward inner conductor 8 such that it functions as an electric open end for the double wave. Additionally, in this example, two Gunn diodes 2 are arranged on slot line resonator circuit 7 at locations which are geometrically symmetric, viewed from the electric open end (left end of slot line resonator circuit 7 in FIG. 11A) and its geometrically symmetric point (right end of slot line resonator circuit 7 in FIG. 11A) in the vicinities including the upper and lower ends of slot line resonator circuit 7.

In this high frequency oscillator, since slot line resonator circuit 7 has the electric length equal to a half-integer multiple of the wavelength at the fundamental frequency, the right end point, i.e., the position at which output line 6 is electromagnetically coupled, defines a zero potential point for the fundamental frequency component. As such, the fundamental frequency component $f_0$ does not appear on output line 6. On the other hand, with respect to double wave component $2f_0$ having the frequency twice as high as the fundamental frequency, since slot line resonator circuit 7 has the electric length equal to an integer multiple of the wavelength of the double wave, a maximum potential point is defined at the position at which output line 6 is electromagnetically coupled. In this manner, double wave output $2f_0$ generated by two Gunn diodes 2 can be delivered from output line 6.

Similarly, the two-phase push-push oscillation can be implemented using the high frequency oscillator of the second or third embodiment. When using the high frequency oscillator of the second or third embodiment, since slot line resonator circuit 7 is configured such that the electric boundary point functions as an electrically short-circuited end, the electric length of slot line resonator circuit 7 is set at an integer multiple of the wavelength λ corresponding to the fundamental frequency component $f_0$. Two Gunn diodes 2 are placed at electrically equipotential points, viewed from output line 6, thereby generating double wave $2f_0$. As appreciated from the foregoing, the push-push oscillation can be readily implemented only by changing the electric length of slot line resonator circuit 7 even with the high frequency oscillation of any of the embodiments described above.

Figure 12A:
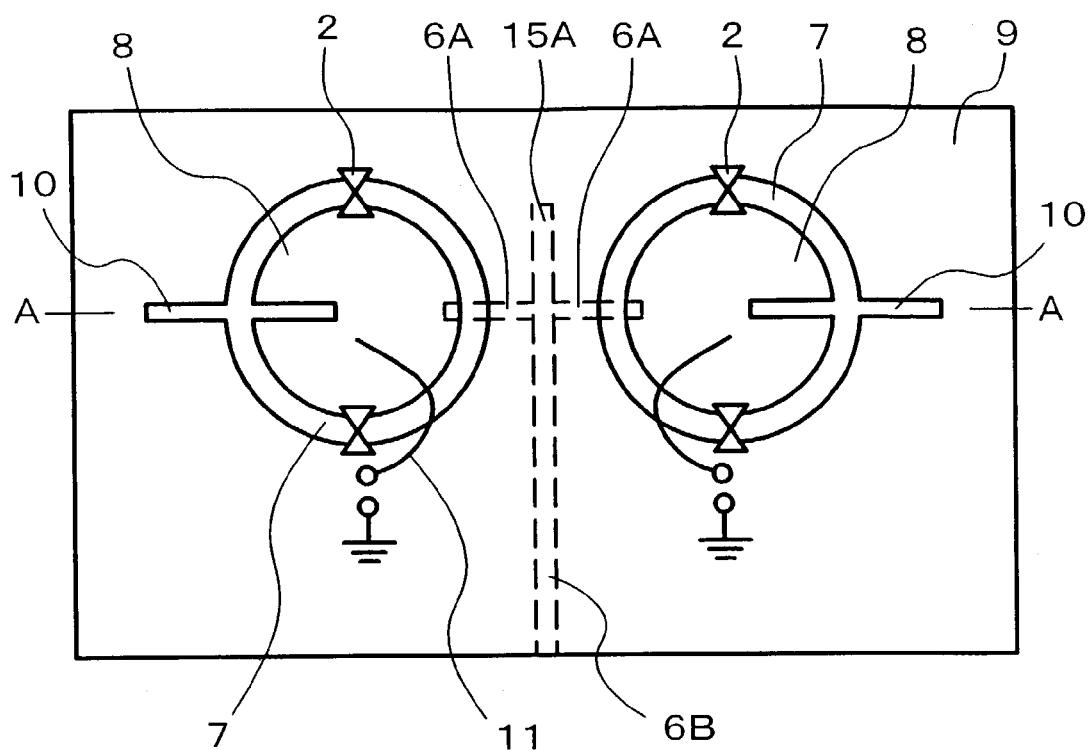
FIG. 12A is a plan view illustrating a four-phase push-push high frequency oscillator according to a seventh embodiment of the present invention.
Figure 12B:
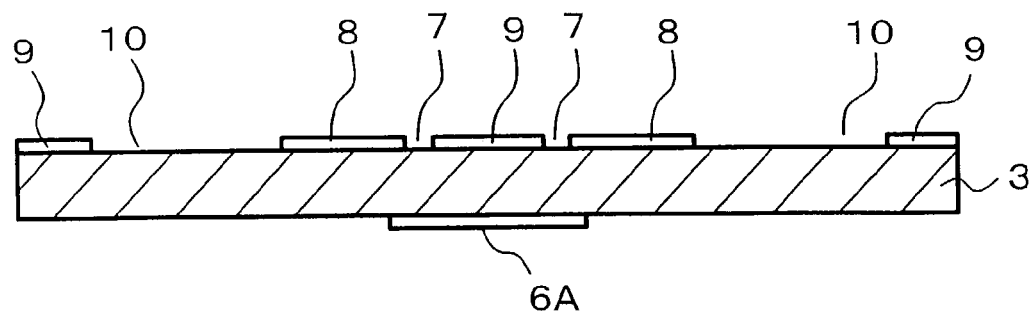
FIG. 12B is a cross-sectional view along a line A—A in FIG. 12A.

Next, a high frequency oscillator of a four-phase push-push type according to a seventh embodiment of the present invention will be described with reference to FIGS. 12A and 12B. Here, a couple of the aforementioned two-phase push-push high frequency oscillators according to the sixth embodiment are connected to generate a quadruple wave $4f_0$ having a frequency four times as high as the fundamental frequency $f_0$ on the principle of push-push oscillation.

Specifically, the four-phase push-push high frequency oscillator comprises a couple of the two-phase push-push oscillators illustrated in the sixth embodiment, which are placed side by side such that the output sides of respective slot line resonator circuits 7 oppose each other. Respective output lines 6 are commonly connected on the other principal surface of substrate 3. The commonly connected output lines are called "common output line 6A," the electric length of which is set at approximately one half of the wavelength corresponding to double wave $2f_0$. From the midpoint of common output line 6A, microstrip line stub 15 is extended. Microstrip line stub 15 has a length equal to one-quarter wavelength for double wave $2f_0$, and is open at the leading end. Further, on the other principal surface of substrate 3, combination output line 6B in a microstrip line structure is routed and connected to the midpoint of common output line 6A.

In the configuration as described above, common output line 6A functions as a half-wavelength resonator for double wave $2f_0$, and the couple of two-phase push-push oscillators disposed on the left and right sides of common output line 6A oscillates in opposite phase to each other. Therefore, based on the principle of the push-push oscillation, combination output line 6B delivers quadruple wave $4f_0$ which has a frequency component twice as high as the double wave, i.e., a frequency component four times as high as the fundamental oscillation frequency $f_0$. Similar to the aforementioned embodiments, the four-phase push-push oscillator can be implemented in a simple configuration. Moreover, the four-phase push-push oscillators can be again combined to generate even higher-order harmonic components.

Each of the embodiments described above employs a microstrip line routed on the other principal surface of substrate 3 for output line 6 electrically connected to slot line resonator circuit 7. The present invention, however, is not limited to this particular form of output line 6. Alternatively, a coplanar line or a slot line may be employed for output line 6.

Figure 13A:
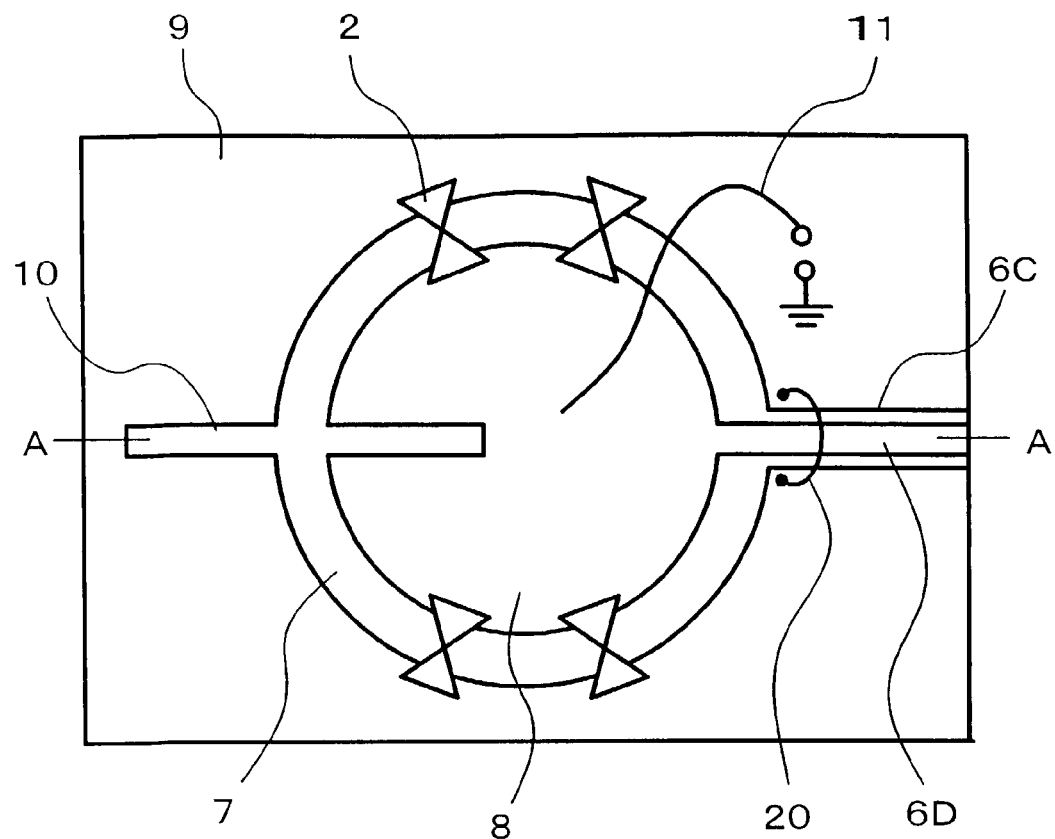
FIG. 13A is a plan view illustrating a high frequency oscillator having a coplanar line output according to another embodiment of the present invention.
Figure 13B:
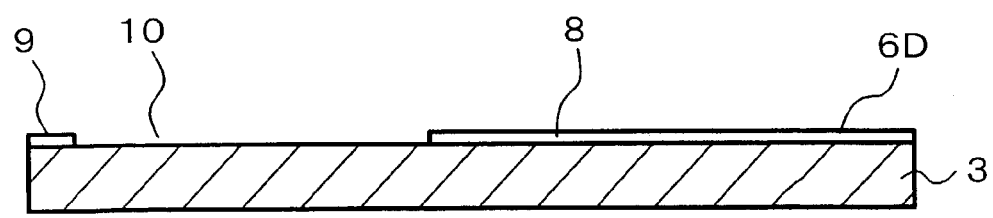
FIG. 13B is a cross-sectional view along a line A—A in FIG. 13A.

A high frequency oscillator illustrated in FIGS. 13A and 13B comprises coplanar line (i.e., coplanar waveguide) 6C formed in outer conductor 9 as an output line, in place of output line 6 in the high frequency oscillator of the first embodiment. Signal line 6D of coplanar line 6C traverses the slot line of slot line resonator circuit 7, and is directly connected to inner conductor 8. When a coplanar line is used to route an output line, portions of outer conductor 9 located both sides of signal line 6D are preferably interconnected through wire 20, air bridge, or the like to place them at the same potential.

Figure 14A:
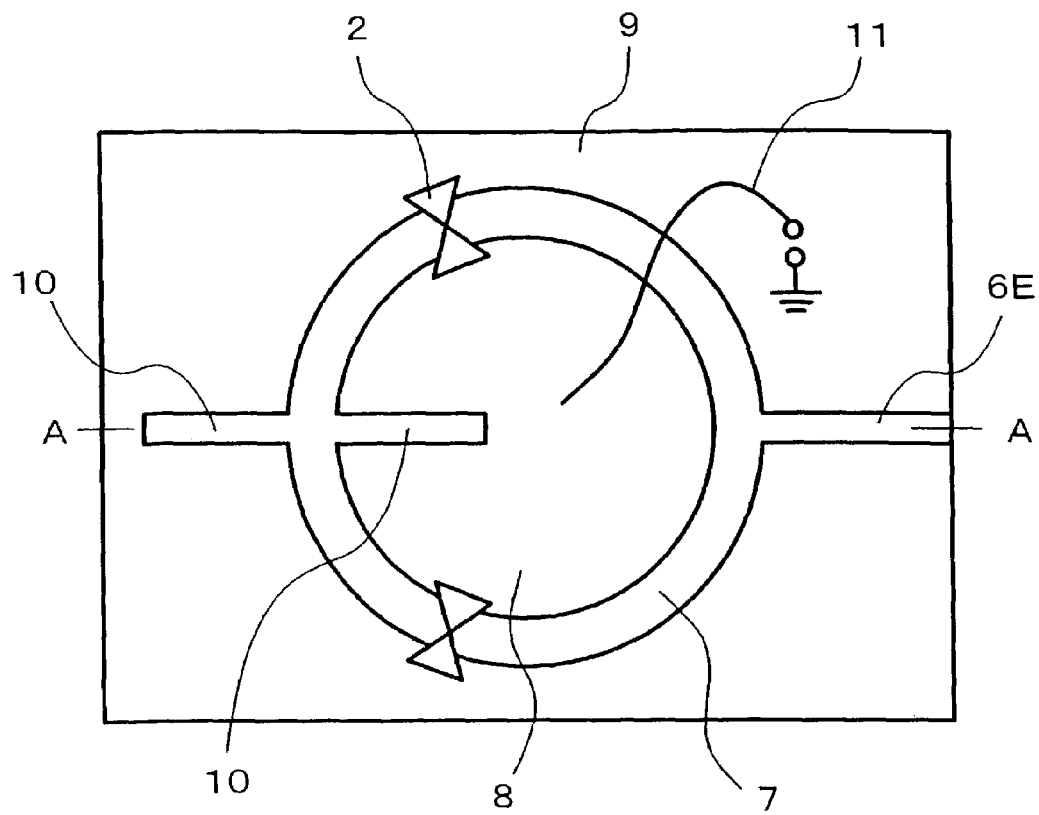
FIG. 14A is a plan view illustrating a high frequency oscillator having a slot line output according to another embodiment of the present invention.
Figure 14B:
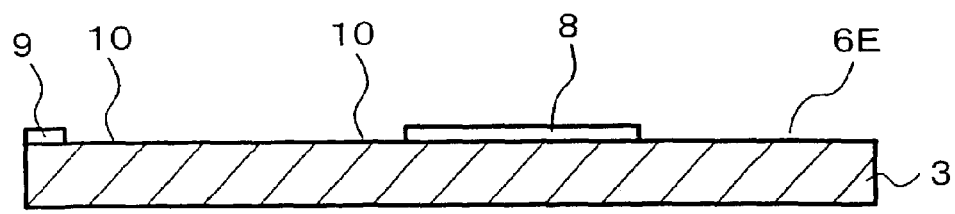
FIG. 14B is a cross-sectional view along a line A—A in FIG. 14A.

A high frequency oscillator illustrated in FIGS. 14A and 14B comprises slot line 6E formed in outer conductor 9 as an output line, in place of output line 6 in the high frequency oscillator of the first embodiment. Slot line 6E is directly connected to the slot line of slot line resonator circuit 7.

The use of a coplanar line or a slot line to route the output line is particularly advantageous when difficulties are encountered in utilizing both sides of the substrate because the slot line resonator circuit and output line are formed on the same principal surface of the substrate in either case.

While each of the embodiments described above delivers the oscillation output through a transmission line such as a microstrip line, the present invention is not limited to this form of providing the oscillation output. For example, a functional circuit such as IC, i.e., an output element may be connected to the inner conductor and outer conductor at geometrically symmetric positions on the slot line resonator circuit to lead out the output through the functional circuit. Also, while the output line extends from the geometrically symmetric point in the opposite direction with respect to the electric boundary point on the slot line resonator circuit, this is not applied if a delay time which is not negligible is caused by a negative resistance element such as a Gunn diode. In any case, the output line may be connected to an electrically symmetric point on a slot line resonator circuit formed in a loop shape, to which the slot line extends from the electrically boundary point in the clockwise direction over an equal electric length to the slot line extending in the counter-clockwise direction. Further, while each of the embodiments described above has the output line connected to the maximum voltage point on the slot line resonator circuit, the oscillation output can be delivered through the output line no matter where it is connected to the slot line resonator circuit, as long as the output line is loosely coupled to the slot line resonator circuit.

In the respective embodiments described above, the Gunn diodes, functioning as negative resistance elements, are positioned at or near the minimum voltage points of the slot line resonator circuit. However, the positioning of the Gunn diodes is not limited to such locations, but the negative resistance elements such as Gunn diodes may be positioned anywhere in accordance with the impedance thereof.

The line lengths of the slot line stub and microstrip line stub for forming the electric boundary point are set at a half wavelength or a quarter wavelength. However, these line lengths need not be strictly observed. The slot line stub and microstrip line stub may be changed in line length within a range in which they can actually function as the electric boundary point.

The slot line resonator circuit is not limited to be circular in shape, but may be in any shape as long as its slot line forms a closed loop. For example, a square slot line resonator circuit may be used instead.

What is claimed is:

1. A high frequency oscillator comprising:
   a substrate;
   a resonator circuit disposed on one principal surface of said substrate, said resonator circuit comprising a closed loop-shaped slot line including an inner conductor and an outer conductor, said slot line having a line length equal to an integer multiple of a wavelength corresponding to an oscillation frequency;
   an electric boundary point set on said slot line such that the electric boundary point functions as an electrically open end, said electric boundary point being a maximum voltage point of a component of the oscillation frequency;
   a two-port negative resistance element for connecting between said inner conductor and said outer conductor; and
   output means electrically connected to said slot line at a position such that a clockwise distance along said slot line from said position to said electric boundary point is equal to a counterclockwise distance along said slot line from said position to said electric boundary point, said position corresponding to another maximum voltage point of the component of the oscillation frequency.

2. The high frequency oscillator according to claim 1, wherein said output means comprises a transmission line.

3. The high frequency oscillator according to claim 1, wherein said electric boundary point comprises a slot line stub disposed on said one principal surface and connected in series with said slot line, said slot line stub having a line length of one quarter wavelength for the oscillation frequency.

4. The high frequency oscillator according to claim 1, wherein said electric boundary point comprises a microstrip line routed on the other principal surface of said substrate for electrically coupling both said inner conductor and said outer conductor, said electric boundary point being configured as an electrically short-circuited end by action of said microstrip line.

5. The high frequency oscillator according to claim 4, wherein said slot line has a line length equal to a half-integer multiple of a wavelength corresponding to an oscillation frequency.

6. The high frequency oscillator according to claim 1, wherein said electric boundary point comprises a capacitor for connecting between said inner conductor and said outer conductor at one point on said slot line, said electric boundary point being configured as electrically short-circuited end.

7. The high frequency oscillator according to claim 6, wherein said slot line has a line length equal to a half-integer multiple of a wavelength corresponding to an oscillation frequency.

8. The high frequency oscillator according to claim 2, wherein said transmission line comprises a microstrip line routed on the other principal surface of said substrate and electromagnetically coupled to said slot line.

9. The high frequency oscillator according to claim 2, wherein said transmission line comprises a coplanar line routed on said one principal surface and connected in series with said slot line.

10. The high frequency oscillator according to claim 2, wherein said transmission line comprises an output slot line routed on said one principal surface and connected in series with said slot line.

11. The high frequency oscillator according to claim 1, wherein said output means comprises a two-port functional circuit element connected to said inner conductor and said outer conductor across said slot line.

12. The high frequency oscillator according to claim 1, wherein said two-port negative resistance element is a Gunn diode.

13. The high frequency oscillator according to claim 1, wherein said two-port negative resistance element is disposed on said slot line at a position at which impedance matching is achieved.

14. The high frequency oscillator according to claim 13, comprising an even number of said two-port negative resistance elements.

15. The high frequency oscillator according to claim 2, wherein said transmission line is electrically connected to said slot line at a symmetric point at which a path extending along said slot line from said electric boundary point to said symmetric point in a clockwise direction is equal in electric length to a path in a counter-clockwise direction.

16. The high frequency oscillator according to claim 1, further comprising:
   a variable reactance element disposed at said electric boundary point; and means for applying a control voltage to said variable reactance element.

17. The high frequency oscillator according to claim 1, further comprising means for injecting a sub-harmonic synchronization signal to said inner conductor.

18. The high frequency oscillator according to claim 2, wherein:
said electric boundary point functions as an electrically open end;
said slot line has a line length equal to a half-integer multiple of a wavelength corresponding to a fundamental oscillation frequency;
said transmission line is electrically connected to said slot line at a symmetric point at which a path extending along said slot line from said electric boundary point to said symmetric point in a clockwise direction is equal in electric length to a path in a counter-clockwise direction; and
said transmission line delivers a component at a frequency twice as high as said fundamental oscillation frequency.

19. The high frequency oscillator according to claim 2, wherein:
said electric boundary point functions as an electrically short-circuited end;
said slot line has a line length equal to an integer multiple of a wavelength corresponding to a fundamental oscillation frequency;
said transmission line is electrically connected to said slot line at a symmetric point at which a path extending along said slot line from said electric boundary point to said symmetric point in a clockwise direction is equal in electric length to a path in a counter-clockwise direction; and
said transmission line delivers a component at a frequency twice as high as said fundamental oscillation frequency.

20. A four-phase push-push high frequency oscillator comprising:
a couple of said high frequency oscillator according to claim 18 disposed on the same substrate;
a common output line composed of the transmission lines of said respective high frequency oscillators connected in common;
a microstrip line stub formed on the other principal surface of said substrate and connected to said common output line; and
a combination output line in a microstrip line structure formed on the other principal surface of said substrate and connected to said common output line, said combination output line delivering a component at a frequency four times as high as said fundamental oscillation frequency.

21. The four-phase push-push high frequency oscillator according to claim 20, wherein said common output line comprises a resonator having a line length for oscillating said couple of high frequency oscillators in opposite phase to each other.

22. A four-phase push-push high frequency oscillator comprising:
a couple of said high frequency oscillator according to claim 19 disposed on the same substrate;
a common output line comprised of the transmission lines of said respective high frequency oscillators connected in common;
a microstrip line stub formed on the other principal surface of said substrate and connected to said common output line; and
a combination output line in a microstrip line structure formed on the other principal surface of said substrate and connected to said common output line, said combination output line delivering a component at a frequency four times as high as said fundamental oscillation frequency.

23. The four-phase push-push high frequency oscillator according to claim 22, wherein said common output line comprises a resonator having a line length for oscillating said couple of high frequency oscillators in opposite phase to each other.

* * * * *